(12) United States Patent
Cok et al.

(10) Patent No.: US 11,670,602 B2
(45) Date of Patent: Jun. 6, 2023

(54) SECURE INTEGRATED-CIRCUIT SYSTEMS

(71) Applicant: X-Celeprint Limited, Dublin (IE)

(72) Inventors: Ronald S. Cok, Rochester, NY (US); Joseph Carr, Chapel Hill, NC (US)

(73) Assignee: X-Celeprint Limited, Dublin (IE)

(*) Notice: Subject to any disclaimer, the term of this patent is extended or adjusted under 35 U.S.C. 154(b) by 0 days.

(21) Appl. No.: 17/569,085

(22) Filed: Jan. 5, 2022

(65) Prior Publication Data

US 2022/0130774 A1  Apr. 28, 2022

Related U.S. Application Data

(63) Continuation of application No. 16/747,922, filed on Jan. 21, 2020, now Pat. No. 11,251,139.

(Continued)

(51) Int. Cl.
*H01L 23/00* (2006.01)
*H01L 25/065* (2023.01)
(Continued)

(52) U.S. Cl.
CPC ............ *H01L 23/576* (2013.01); *H01L 22/20* (2013.01); *H01L 22/34* (2013.01);
(Continued)

(58) Field of Classification Search
CPC ............ H01L 25/0652; H01L 25/0657; H01L 25/043; H01L 25/074; H01L 25/0756; H01L 25/117; H01L 2225/06506; H01L 2225/06513; H01L 2225/0651; H01L 2225/06534; H01L 2225/06568; H01L 2225/06503–06596; H01L 2224/48145;
(Continued)

(56) References Cited

U.S. PATENT DOCUMENTS 5,929,650 A * 7/1999 Pappert ............... G01R 31/3008
                                                             714/25
6,142,358 A    11/2000 Cohn et al.
(Continued)

OTHER PUBLICATIONS

Bower, C. A. et al., Emissive displays with transfer-printed assemblies of 8 μm×15 μm inorganic light-emitting diodes, Photonics Research, 5(2):A23-A29, (2017).
(Continued)

*Primary Examiner* — Victor A Mandala
*Assistant Examiner* — Lawrence C Tynes, Jr.
(74) *Attorney, Agent, or Firm* — Choate, Hall & Stewart LLP; Michael D. Schmitt

(57) ABSTRACT

A method of making a secure integrated-circuit system comprises providing a first integrated circuit in a first die having a first die size and providing a second integrated circuit in a second die. The second die size is smaller than the first die size. The second die is transfer printed onto the first die and connected to the first integrated circuit, forming a compound die. The compound die is packaged. The second integrated circuit is operable to monitor the operation of the first integrated circuit and provides a monitor signal responsive to the operation of the first integrated circuit. The first integrated circuit can be constructed in an insecure facility and the second integrated circuit can be constructed in a secure facility.

20 Claims, 18 Drawing Sheets

Related U.S. Application Data

(60) Provisional application No. 62/795,313, filed on Jan. 22, 2019.

(51) Int. Cl.
*H01L 21/66* (2006.01)
*H01L 25/00* (2006.01)

(52) U.S. Cl.
CPC .......... *H01L 25/0657* (2013.01); *H01L 25/50* (2013.01); *H01L 2225/06506* (2013.01); *H01L 2225/06513* (2013.01); *H01L 2225/06534* (2013.01); *H01L 2225/06568* (2013.01); *H01L 2225/06596* (2013.01)

(58) Field of Classification Search
CPC .......... H01L 2224/16145; H01L 22/34; H01L 22/30–34; H01L 22/10–14; H01L 21/67288; G01R 31/2851; G01R 31/2831; G01R 31/26–275; G01R 31/28–2898; G01R 31/30; G01R 1/0491
See application file for complete search history.

(56) References Cited

U.S. PATENT DOCUMENTS

| | | |
|---|---|---|
| 7,195,733 B2 | 3/2007 | Rogers et al. |
| 7,354,801 B2 | 4/2008 | Sugiyama et al. |
| 7,521,292 B2 | 4/2009 | Rogers et al. |
| 7,557,367 B2 | 7/2009 | Rogers et al. |
| 7,622,367 B1 | 11/2009 | Nuzzo et al. |
| 7,662,545 B2 | 2/2010 | Nuzzo et al. |
| 7,704,684 B2 | 4/2010 | Rogers et al. |
| 7,799,699 B2 | 9/2010 | Nuzzo et al. |
| 7,932,123 B2 | 4/2011 | Rogers et al. |
| 7,943,491 B2 | 5/2011 | Nuzzo et al. |
| 7,972,875 B2 | 7/2011 | Rogers et al. |
| 8,333,860 B1 | 12/2012 | Bibi et al. |
| 8,470,701 B2 | 6/2013 | Rogers et al. |
| 8,506,867 B2 | 8/2013 | Menard |
| 8,558,243 B2 | 10/2013 | Bibi et al. |
| 8,722,458 B2 | 5/2014 | Rogers et al. |
| 8,791,474 B1 | 7/2014 | Bibi et al. |
| 8,794,501 B2 | 8/2014 | Bibi et al. |
| 8,835,940 B2 | 9/2014 | Hu et al. |
| 8,865,489 B2 | 10/2014 | Rogers et al. |
| 8,877,648 B2 | 11/2014 | Bower et al. |
| 8,889,485 B2 | 11/2014 | Bower |
| 8,934,259 B2 | 1/2015 | Bower et al. |
| 8,941,215 B2 | 1/2015 | Hu et al. |
| 8,987,765 B2 | 3/2015 | Bibi et al. |
| 9,049,797 B2 | 6/2015 | Menard et al. |
| 9,087,764 B2 | 7/2015 | Chan et al. |
| 9,105,714 B2 | 8/2015 | Hu et al. |
| 9,111,464 B2 | 8/2015 | Bibi et al. |
| 9,139,425 B2 | 9/2015 | Vestyck |
| 9,153,171 B2 | 10/2015 | Sakariya et al. |
| 9,161,448 B2 | 10/2015 | Menard et al. |
| 9,165,989 B2 | 10/2015 | Bower et al. |
| 9,166,114 B2 | 10/2015 | Hu et al. |
| 9,178,123 B2 | 11/2015 | Sakariya et al. |
| 9,217,541 B2 | 12/2015 | Bathurst et al. |
| 9,240,397 B2 | 1/2016 | Bibi et al. |
| 9,252,375 B2 | 2/2016 | Bibi et al. |
| 9,355,854 B2 | 5/2016 | Meitl et al. |
| 9,358,775 B2 | 6/2016 | Bower et al. |
| 9,367,094 B2 | 6/2016 | Bibi et al. |
| 9,412,727 B2 | 8/2016 | Menard et al. |
| 9,478,583 B2 | 10/2016 | Hu et al. |
| 9,484,504 B2 | 11/2016 | Bibi et al. |
| 9,520,537 B2 | 12/2016 | Bower et al. |
| 9,555,644 B2 | 1/2017 | Rogers et al. |
| 9,583,533 B2 | 2/2017 | Hu et al. |
| 9,589,944 B2 | 3/2017 | Higginson et al. |
| 9,601,356 B2 | 3/2017 | Bower et al. |
| 9,640,715 B2 | 5/2017 | Bower et al. |
| 9,716,082 B2 | 7/2017 | Bower et al. |
| 9,761,754 B2 | 9/2017 | Bower et al. |
| 9,765,934 B2 | 9/2017 | Rogers et al. |
| 9,865,832 B2 | 1/2018 | Bibi et al. |
| 9,929,053 B2 | 3/2018 | Bower et al. |
| 10,103,069 B2 | 10/2018 | Bower et al. |
| 10,153,256 B2 | 12/2018 | Cok et al. |
| 10,224,460 B2 | 3/2019 | Bower et al. |
| 10,418,780 B1 | 9/2019 | Hwang et al. |
| 10,468,363 B2 | 11/2019 | Prevatte et al. |
| 11,322,460 B2 | 5/2022 | Cok et al. |
| 2003/0141570 A1 | 7/2003 | Chen et al. |
| 2008/0272372 A1 | 11/2008 | Luo et al. |
| 2010/0127729 A1 | 5/2010 | Zjajo |
| 2010/0306993 A1 | 12/2010 | Mayyas et al. |
| 2010/0315476 A1 | 12/2010 | Sheats |
| 2013/0309792 A1 | 11/2013 | Tischler et al. |
| 2013/0316487 A1 | 11/2013 | de Graff et al. |
| 2014/0159043 A1 | 6/2014 | Sakariya et al. |
| 2015/0028918 A1 | 1/2015 | Hutton |
| 2015/0333738 A1 | 11/2015 | Clark et al. |
| 2016/0093600 A1 | 3/2016 | Bower et al. |
| 2017/0310688 A1 | 10/2017 | Lecomte et al. |
| 2017/0338374 A1 | 11/2017 | Zou et al. |
| 2018/0004944 A1 | 1/2018 | Nagata et al. |
| 2018/0261658 A1 | 9/2018 | Cok et al. |
| 2019/0348573 A1 | 11/2019 | Raymond et al. |
| 2019/0371781 A1 | 12/2019 | Huang et al. |
| 2020/0006324 A1 | 1/2020 | Chen et al. |
| 2020/0235059 A1 | 7/2020 | Cok et al. |
| 2020/0395316 A1* | 12/2020 | Cok ........................ H01L 24/75 |

OTHER PUBLICATIONS

Bower, C. A. et al., Micro-Transfer-Printing: Heterogeneous Integration of Microscale Semiconductor Devises using Elastomer Stamps, IEEE Conference, (2014).

Bower, C. A. et al., Transfer Printing: An Approach for Massively Parallel Assembly of Microscale Devices, IEEE, Electronic Components and Technology Conference, (2008).

Cok, R. S. et al., 60.3: AMOLED Displays Using Transfer-Printed Integrated Circuits, Society for Information Display, 10:902-904, (2010).

Cok, R. S. et al., Inorganic light-emitting diode displays using micro-transfer printing, Journal of the SID, 25(10):589-609, (2017).

Cok, R. S. et. al., AMOLED displays with transfer-printed integrated circuits, Journal of SID, 19(4):335-341, (2011).

Feng, X. et al., Competing Fracture in Kinetically Controlled Transfer Printing, Langmuir, 23(25):12555-12560, (2007).

Gent, A.N., Adhesion and Strength of Viscoelastic Solids. Is There a Relationship between Adhesion and Bulk Properties, American Chemical Society, Langmuir, 12(19):4492-4496, (1996).

Kim, Dae-Hyeong et al., Optimized Structural Designs for Stretchable Silicon Integrated Circuits, Small, 5(24):2841-2847, (2009).

Kim, Dae-Hyeong et al., Stretchable and Foldable Silicon Integrated Circuits, Science, 320:507-511, (2008).

Kim, S. et al., Microstructured elastomeric surfaces with reversible adhesion and examples of their use in deterministic assembly by transfer printing, PNAS, 107(40):17095-17100 (2010).

Kim, T. et al., Kinetically controlled, adhesiveless transfer printing using microstructured stamps, Applied Physics Letters, 94(11):113502-1-113502-3, (2009).

Meitl, M. A. et al., Transfer printing by kinetic control of adhesion to an elastomeric stamp, Nature Material, 5:33-38, (2006).

Michel, B. et al., Printing meets lithography: Soft approaches to high-resolution patterning, J. Res. & Dev. 45(5):697-708, (2001).

Trindade, A.J. et al., Precision transfer printing of ultra-thin AlInGaN micron-size light-emitting diodes, Crown, pp. 217-218, (2012).

* cited by examiner

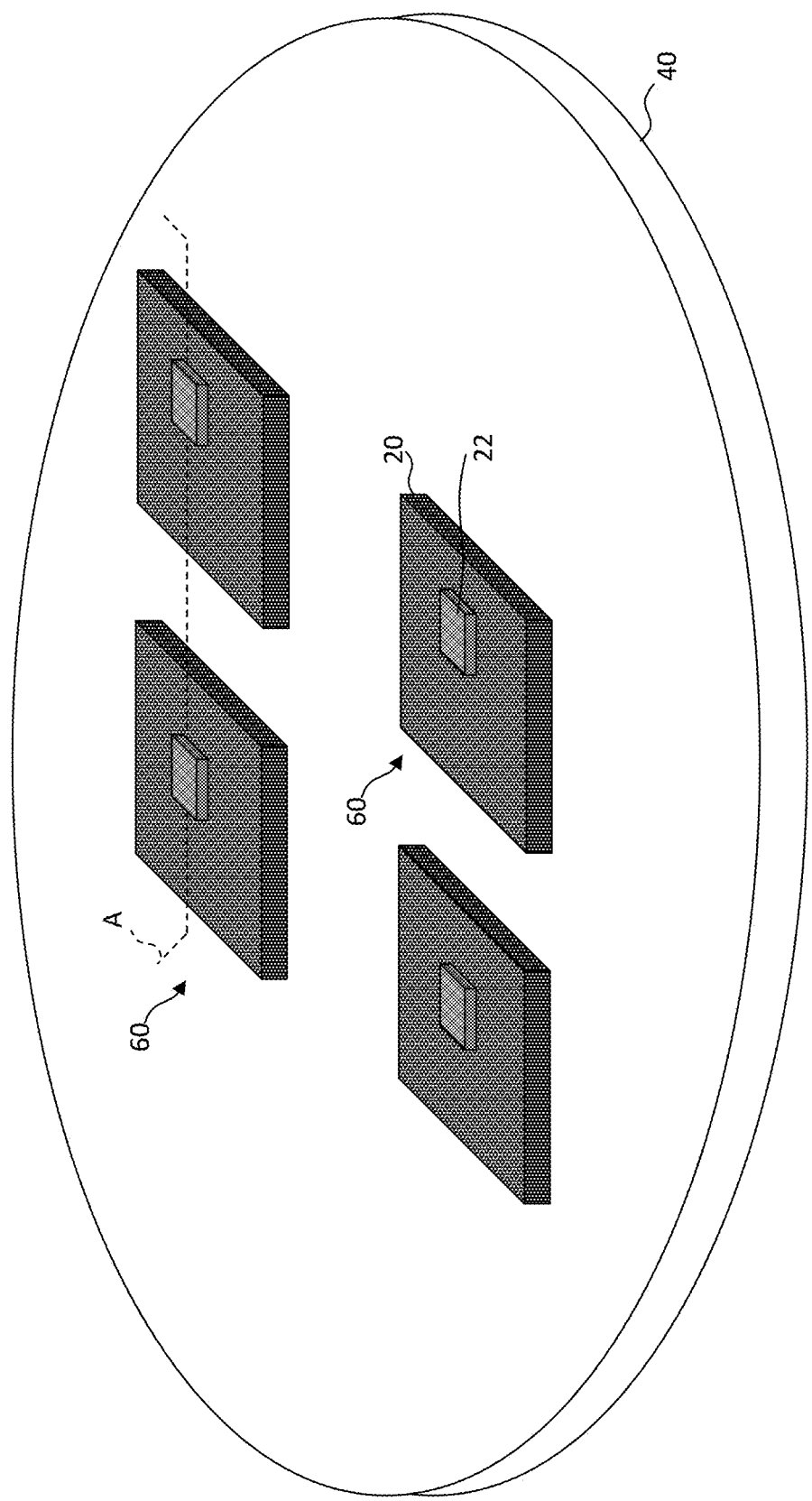

SECURE INTEGRATED-CIRCUIT SYSTEMS

PRIORITY APPLICATION

This application is a continuation of U.S. patent application Ser. No. 16/747,922, filed on Jan. 21, 2020, which claims the benefit of U.S. Provisional Patent Application No. 62/795,313, filed on Jan. 22, 2019, the disclosure of each of which is incorporated by reference herein in its entirety.

TECHNICAL FIELD

The present disclosure relates generally to structures and methods for secure hardware systems incorporating small monitor integrated circuits.

BACKGROUND

Electronic and photonic systems typically employ many different components supplied from a wide variety of sources in many different countries. Such diverse sources can be difficult to manage and secure to ensure that every component is constructed to specification by a manufacturer of the end system. For example, a hardware system can inadvertently incorporate malicious circuitry. Exhaustively testing every component at every stage of construction and integration can be difficult and prohibitively expensive. By interrupting the technology supply chain in some fashion, inimical actors can compromise the security and performance of electronic or photonic systems, for example by inserting undesirable and malicious circuitry into a system or by covertly redesigning components that are then employed in a compromised system. Such compromised systems can be accessed to retrieve information or to inhibit the performance of the compromised systems.

Monitor circuits for establishing appropriate operation are sometimes used to ensure that a circuit is operating as desired. Such monitor circuits typically provide a monitor signal when the circuit operation is no longer within specification. For example, power systems can include monitor circuits to ensure that the power supplied meets the desired specifications. Circuits for checking bit errors in communication systems are used to detect and correct such errors. However, such systems typically require relatively large monitor circuits that are not readily integrated into a small system.

There is a need, therefore, for systems, structures, devices, and methods that provide secure hardware systems where components of the hardware system are not under the complete control of the hardware system manufacturer.

SUMMARY

The present disclosure provides, inter alia, structures, materials, and methods that provide secure hardware systems, for example where components of the hardware system are not under the complete control of the hardware system manufacturer.

According to some embodiments, a method of making a secure integrated-circuit system comprises providing a first integrated circuit in a first die having a first die size and providing a second integrated circuit in a second die. The second die size is smaller than the first die size. The second die is transfer printed onto the first die and connected to the first integrated circuit, forming a compound die. The compound die is packaged. The second integrated circuit monitors the operation of the first integrated circuit and provides a monitor signal responsive to the operation of the first integrated circuit. The first integrated circuit can be constructed in an insecure facility and the second integrated circuit in a secure facility.

According to some embodiments, the first die has an area that is ten, twenty, fifty, one hundred, two hundred and fifty, five hundred, one thousand, five thousand, ten thousand times, one hundred thousand times, one million times, one hundred million times, one billion times, or larger than an area of the second die. According to some embodiments, the second die has a length and a width that are both less than or equal to 200 microns, 100 microns, 50 microns, 25 microns, or 10 microns.

The second die can comprise at least a portion of a fractured or separated tether.

According to some embodiments, connecting the second integrated circuit to the first integrated circuit comprises photolithographically forming wires electrically connecting the second integrated circuit to the first integrated circuit. According to some embodiments, the second die comprises one or more connection posts and the first integrated circuit is connected to the second integrated circuit through the one or more connection posts by the step of micro-transfer printing. According to some embodiments, connecting the second integrated circuit to the first integrated circuit comprises wire bonding the second integrated circuit to the first integrated circuit.

According to some embodiments, the connection is an electrical, optical, or electro-optic connection. According to some embodiments, the package comprises a cavity and the step of packaging the compound die comprises disposing the compound die in the cavity. According to some embodiments, the package comprises package leads and the step of packaging the compound die comprises connecting the package leads to the compound die. According to some embodiments, the step of packaging the compound die comprises wire bonding the first integrated circuit to one or more of the package leads. According to some embodiments, the step of packaging the compound die comprises wire bonding the second integrated circuit to one or more of the package leads.

Some embodiments comprise encapsulating the compound die and the compound die is encapsulated, for example with an organic or inorganic dielectric material, such as a resin, an oxide such as silicon dioxide, or a nitride such as silicon nitride.

Some methods comprise providing a plurality of first dies, providing a plurality of second dies, and micro-transfer printing each second die of the plurality of second dies onto a first die. Some methods comprise micro-transfer printing multiple second dies in a common step. Some methods comprise micro-transfer printing only one second die onto each first die. Some methods comprise micro-transfer printing multiple second dies onto each first die. Some methods comprise providing multiple source wafers each having a plurality of second dies and micro-transfer printing a second die from each second wafer onto a common first die. Some methods comprise connecting each second integrated circuit on a common first die together.

According to some embodiments, a secure integrated-circuit system comprises a first integrated circuit in a first die having a first die size and a second integrated circuit in a second die having a second die size smaller than the first die size. The second integrated circuit is operable to monitor the operation of the first integrated circuit and to provide a monitor signal responsive to the operation of the first integrated circuit. The second die is non-native to the first die and the second die can be micro-transfer printed from a source wafer to the first die. The first die can be provided in a destination wafer or destination substrate. The second integrated circuit is connected to the first integrated circuit, such that the first die and the second die together form a compound die. The compound die is disposed in a package.

According to some embodiments, the second die comprises a fractured or separated tether. Two or more second dies can be disposed on a common first die, the two or more second dies connected together to form a monitor circuit.

According to some embodiments, the first integrated circuit is constructed in an insecure facility. The first integrated circuit can incorporate a malicious circuit. The second integrated circuit can be constructed in a secure facility.

According to some embodiments, the first die has an area that is at least ten, (e.g., at least twenty, at least fifty, at least one hundred, at least two hundred and fifty, at least five hundred, at least one thousand, at least five thousand, at least ten thousand times, at least one hundred thousand times, at least one million times, at least one hundred million times, or at least one billion times larger than an area of the second die (e.g., and no more than one hundred thousand times larger, no more than one million times, no more than one hundred million times, no more than one billion times larger than the area of the second die). The second die can have a length and a width that are both no more than 200 microns (e.g., no more than 100 microns, no more than 50 microns, no more than 25 microns, or no more than 10 microns).

According to some embodiments, the second integrated circuit is connected to the first integrated circuit by one or more of an electrical connection, an optical connection, and an electro-optic connection. According to some embodiments, the second integrated circuit is electrically connected to the first integrated circuit with at least one wire bond, one surface wire, or one connection post.

In some embodiments, the components are computers, servers, or communications devices.

BRIEF DESCRIPTION OF THE DRAWINGS

The foregoing and other objects, aspects, features, and advantages of the present disclosure will become more apparent and better understood by referring to the following description taken in conjunction with the accompanying drawings, in which:

FIG. 8A is a perspective and FIG. 8B is a schematic cross section taken along cross section line A of FIG. 8A of compound dies according to illustrative embodiments of the present disclosure;

Figure 6A:
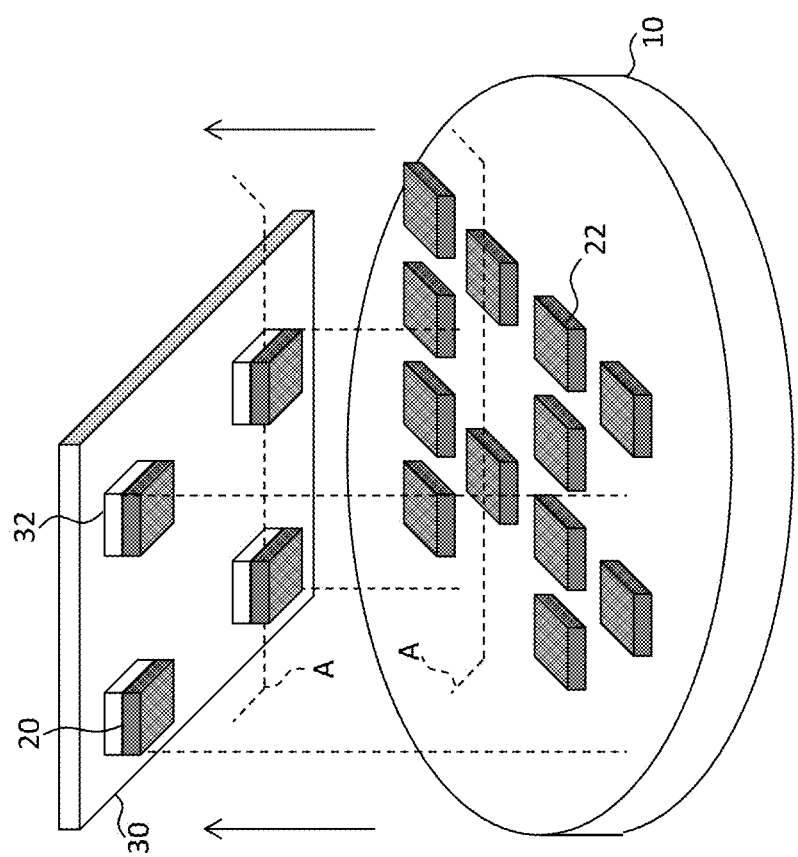
FIG. 6A is a perspective and FIG. 6B is a schematic cross section taken along cross section line A of FIG. 6A of the stamp with the subset of second dies removed from the source wafer according to illustrative embodiments of the present disclosure.
Figure 7A:
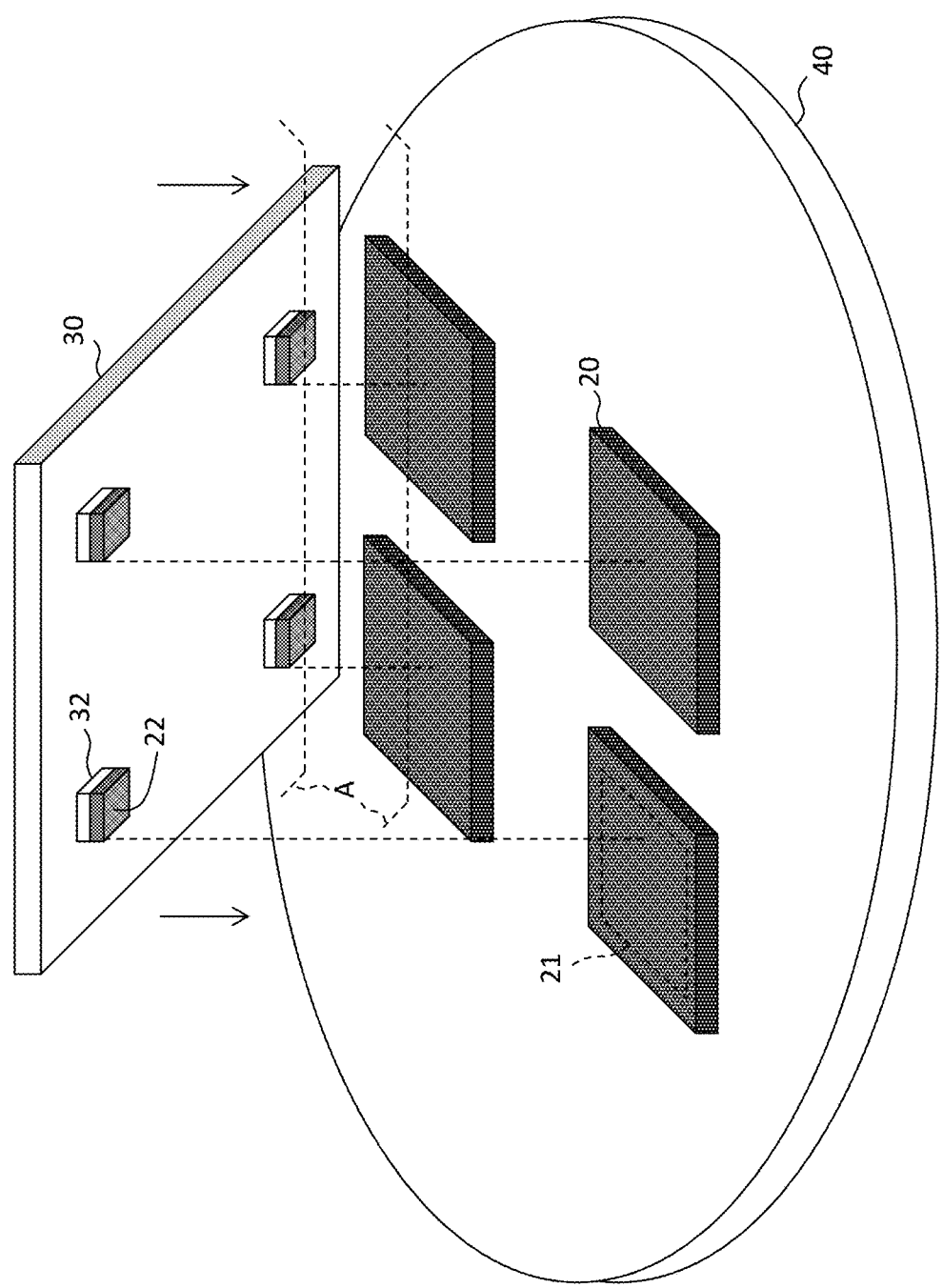
FIG. 7A is a perspective and FIG. 7B is a schematic cross section taken along cross section line A of FIG. 7A of the stamp before micro-transfer printing the subset of second dies from the stamp onto first dies on a destination wafer to form a compound die according to illustrative embodiments of the present disclosure.

The perspectives shown in FIGS. 3A, 6A, and 7A are exploded illustrations with exaggerated viewing angles and the two cross section lines A indicated in some of the perspective Figures are actually congruent.

Features and advantages of the present disclosure will become more apparent from the detailed description set forth below when taken in conjunction with the drawings, in which like reference characters identify corresponding elements throughout. In the drawings, like reference numbers generally indicate identical, functionally similar, and/or structurally similar elements. The figures are not necessarily drawn to scale.

DETAILED DESCRIPTION OF CERTAIN EMBODIMENTS

Certain embodiments of the present disclosure are directed toward methods and structures for providing secure hardware systems when at least some component of the hardware system is constructed or provided in an insecure facility and can incorporate malicious circuitry.

Figure 1:
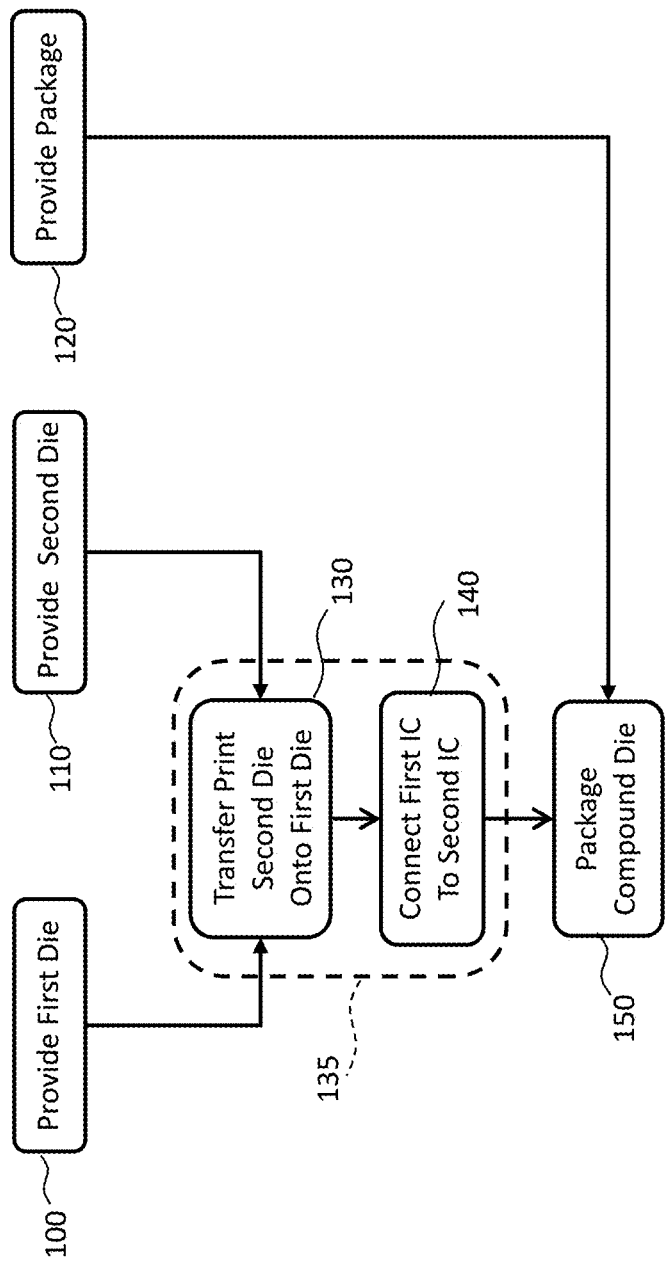
FIG. 1 is a flow diagram according to illustrative embodiments of the present disclosure.
Figure 2:
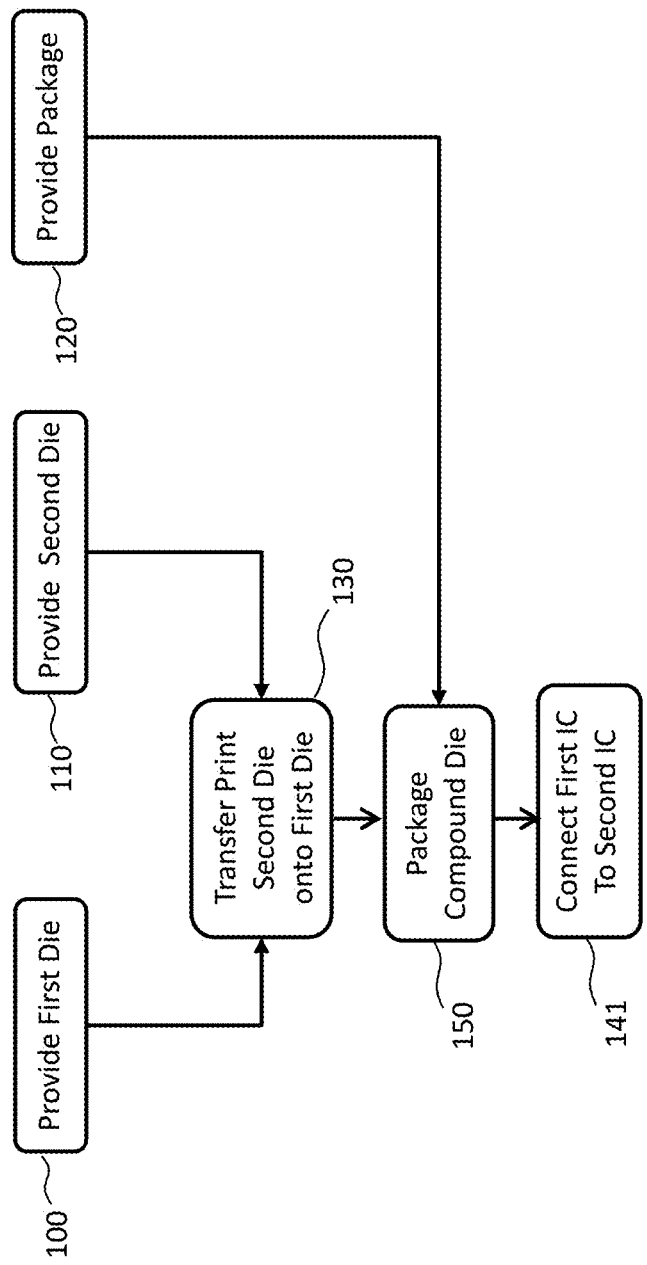
FIG. 2 is a flow diagram according to illustrative embodiments of the present disclosure.
Figure 3:
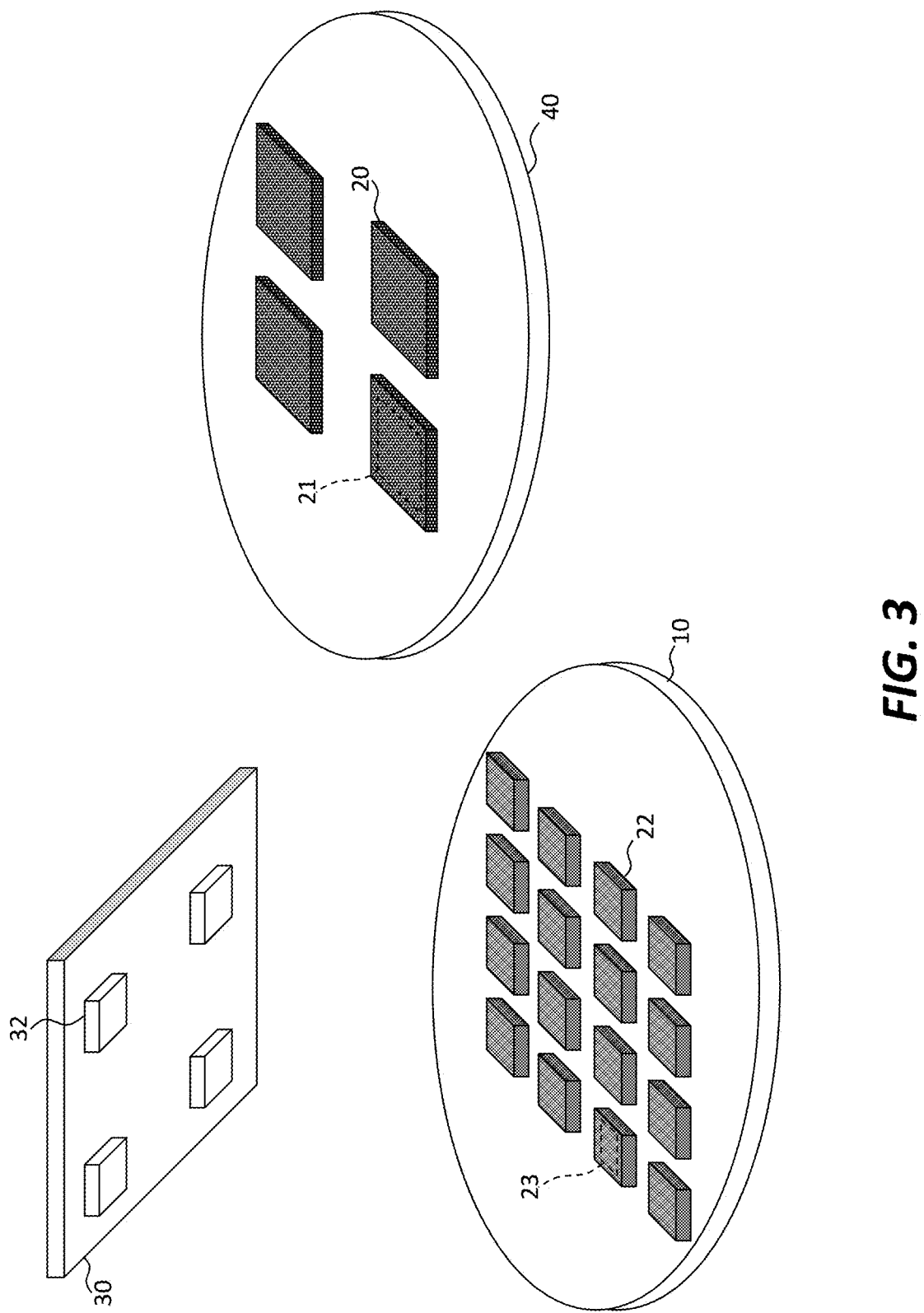
FIG. 3 is a perspective of components useful in various embodiments of the present disclosure.

The flow diagrams of FIGS. 1 and 2 and the sequential cross sections and perspectives of FIGS. 3-8 illustrate methods and structures of some embodiments. Referring specifically to FIG. 3, a method of making a secure integrated-circuit system according to some embodiments comprise providing a first integrated circuit 21 in or on a first die 20 having a first die size in step 100. A plurality of first dies 20 each with first integrated circuits 21 can be provided in a destination wafer 40. First integrated circuit 21 in or on first die 20 can be constructed in an insecure facility. In step 110, a second integrated circuit 23 is provided in or on a second die 22 having a second die size smaller than the first die size. Second integrated circuit 23 can be a monitor circuit. Second integrated circuit 23 can be constructed in a secure facility (e.g., when first integrated circuit 21 is constructed in an insecure facility). First and second integrated circuits 21, 23 can be made in first and second dies 20, 22, respectively, using photolithographic methods and materials. A plurality of second dies 22 each with second integrated circuits 23 can be provided in a source wafer 10. In some embodiments, multiple source wafers 10 are provided each with different second dies 22 comprising different second integrated circuits 23 and multiple, different second dies 22 are disposed on a common first die 20. In step 120, a package 90 is provided. Optionally, a stamp 30 with stamp posts 32 each with a stamp post area on a distal end of each stamp post 32 is provided for use in micro-transfer printing, for example micro-transfer printing second dies 22 onto first dies 20 or into package 90.

Figure 11:
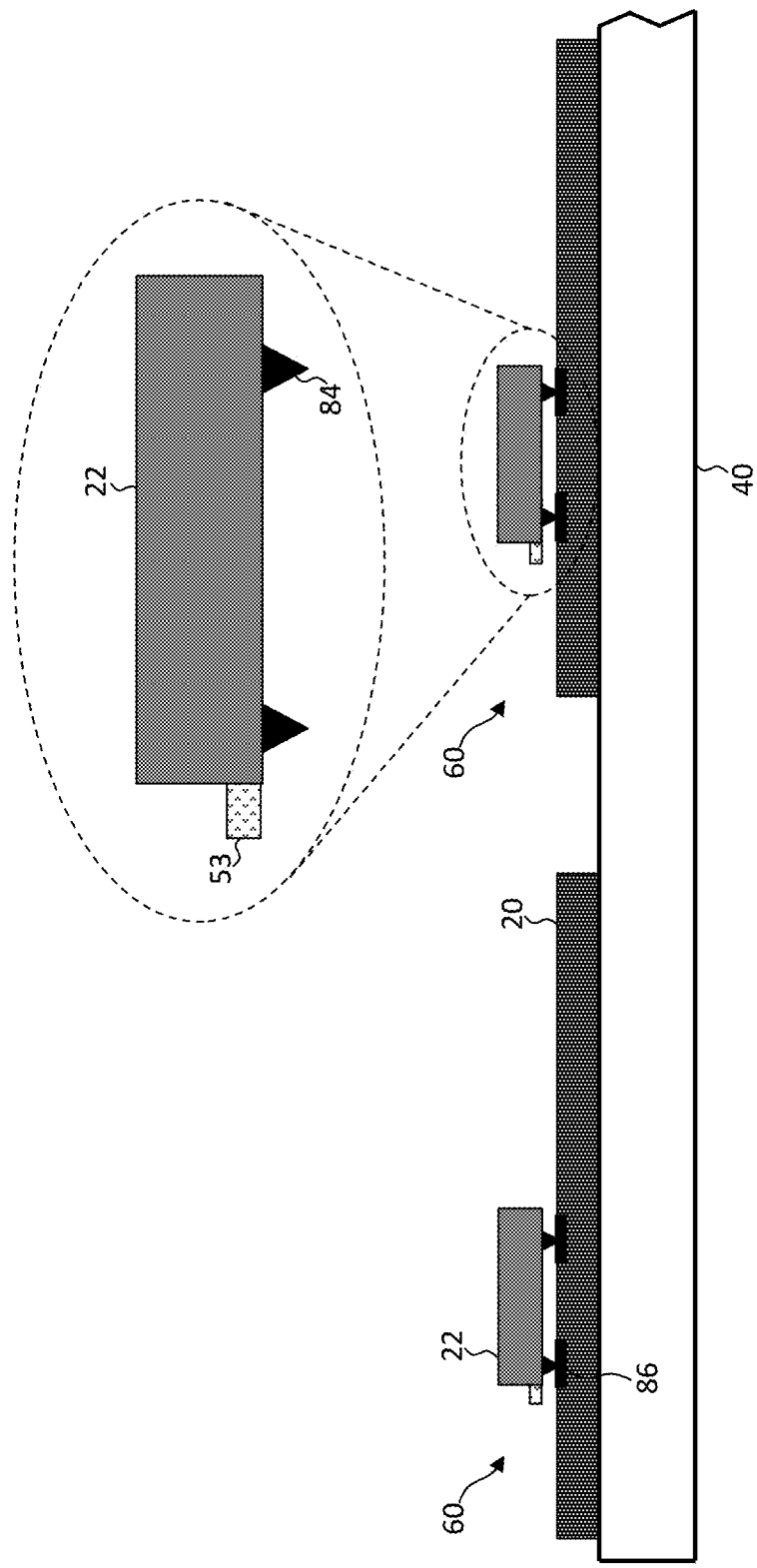
FIG. 11 is a schematic cross section with connection posts according to illustrative embodiments of the present disclosure.
Figure 12:
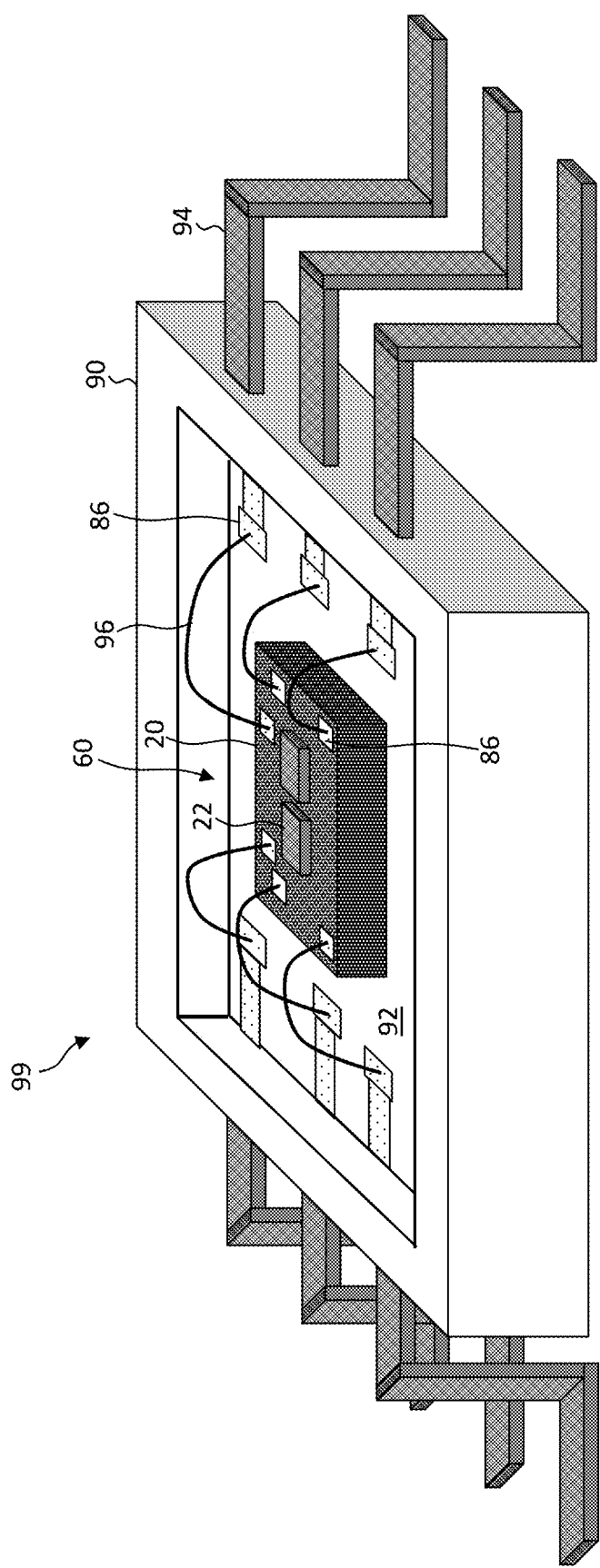
FIG. 12 is a perspective of a compound die in a package according to illustrative embodiments of the present disclosure.

In step 130, second die 22 is transfer printed (for example micro-transfer printed using stamp 30) onto first die 20 and second integrated circuit 23 is connected to first integrated circuit 21, to provide a compound die 60. Optionally, second integrated circuit 23 can be connected to first integrated circuit 21 by the step 130 of transfer printing second die 22 onto first die 20 (as represented in FIG. 1 with combined step 135) or can be connected after transfer printing second die 22 onto first die 20 (as shown in step 140 of FIG. 1), for example using photolithographic or wire bonding materials and methods (see, for example, FIGS. 9-11 and 13-15, discussed further below). Compound die 60 is then packaged, for example with a plastic or ceramic package 90 (e.g., as shown in FIG. 12, discussed below) as are commonly used in the integrated circuit industry. A package 90 is a container that contains compound die 60 and, in some embodiments, provides connections, for example with package leads 94, to first and second integrated circuits 21, 23. As shown in FIG. 2, in some embodiments, second integrated circuit 23 can be connected to first integrated circuit 21 after packaging in step 141 (as shown in FIG. 2), rather than before packaging (as shown in FIG. 1).

In operation, second integrated circuit 23 monitors the behavior of first integrated circuit 21 and provides a monitor signal 74 (see, for example, FIG. 16, discussed further below) responsive to any combination of the behavior, performance, or operation of first integrated circuit 21 that is undesired. Monitor signal 74 can be electronic, optical, or can use other communication modalities and energy types. According to some embodiments, first integrated circuit 21 inadvertently incorporates undesired malicious circuitry when first integrated circuit 21 is constructed in an insecure facility. A malicious circuit can be an undesired circuit provided in first integrated circuit 21 that purposely performs functions or operates in a way that is deleterious or disruptive to the desired function of or interferes with a secure integrated-circuit system 99 (e.g., shown in FIG. 12) incorporating first integrated-circuit 21.

Figure 4A:
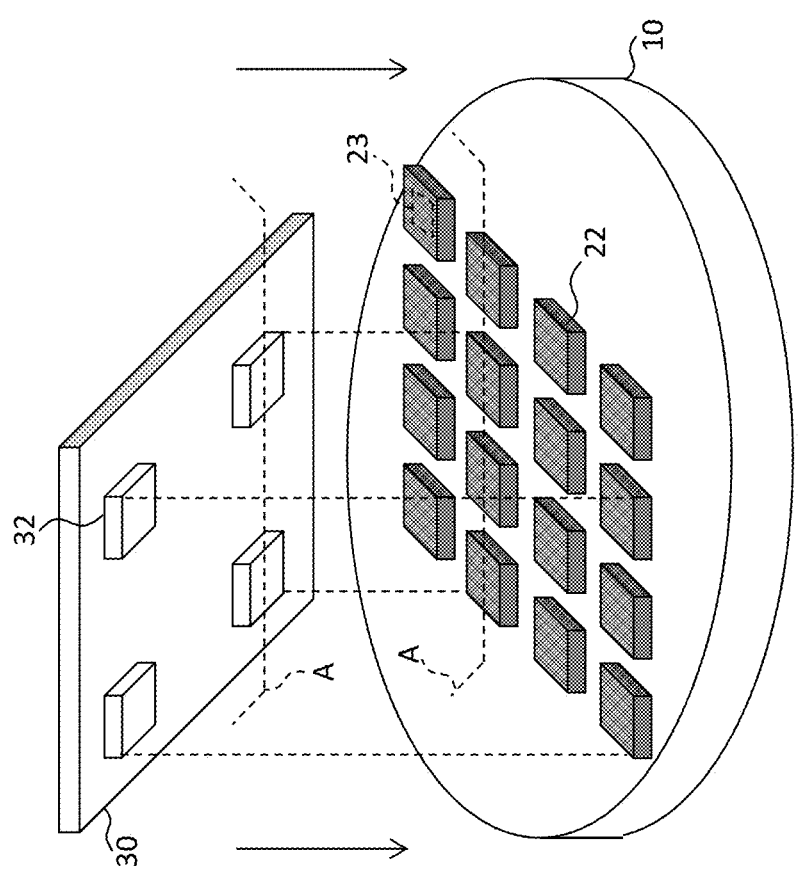
FIG. 4A is a perspective and FIG. 4B is a schematic cross section taken along cross section line A of FIG. 4A of a stamp and source wafer according to illustrative embodiments of the present disclosure.
Figure 4B:
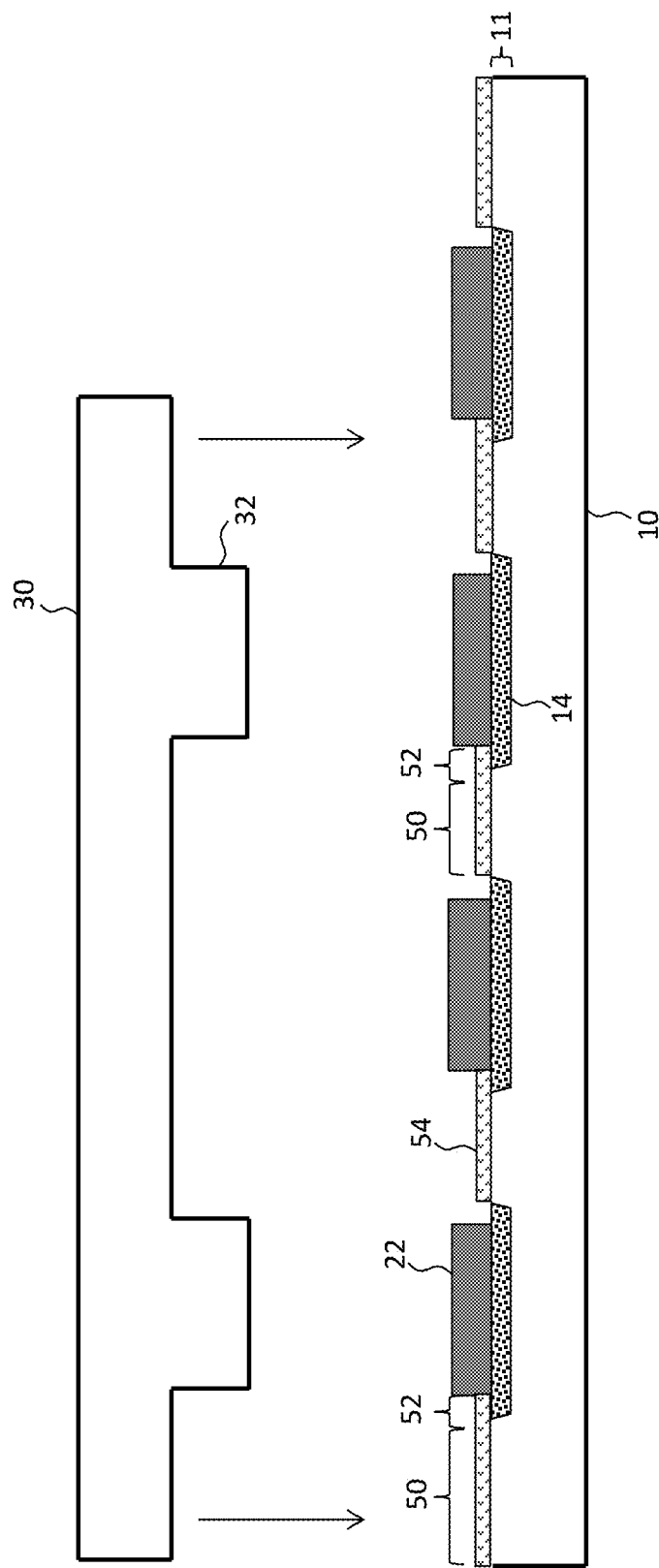

The sequential cross sections and perspectives of FIGS. 4A-9, illustrate in more detail a method of transfer printing (step 130) second die 22 onto first die 20, according to some embodiments of the present disclosure. Referring to the exploded FIG. 4A perspective and corresponding cross section FIG. 4B taken along cross section line A of FIG. 4A, stamp posts 32 protrude from stamp 30 to contact second dies 22 when stamp 30 is pressed against second dies 22, for example using an opto-mechatronic motion platform and control system. As shown in FIG. 4B, second dies 22 are entirely disposed over, and can be formed on, sacrificial portions 14 spatially separated by anchors 50 in sacrificial layer 11 of source wafer 10. Sacrificial layer 11 can be a patterned sacrificial layer 11 or an anisotropically etchable layer of source wafer 10. For example, second dies 22 can be, but are not necessarily, arranged in a rectangular array, for example in a regular two-dimensional array, as shown in FIG. 4A. A dielectric layer 54 disposed over source wafer 10 and sacrificial portions 14 connects each second die 22 with a tether 52 to an anchor 50. In some embodiments, one or more tethers 52 connect a second die 22 to each of one or more anchors 50. Tethers 52 can be laterally connected to anchors 50 (e.g., as shown) or disposed in other locations, for example beneath second dies 22. In some embodiments, first dies 20 are also provided on a source wafer and transferred to a package 90 (e.g., before or after (i) second dies 22 are transferred to first dies 20 and/or (ii) first integrated circuits 21 are electrically connected to second integrated circuits 23).

Figure 5:
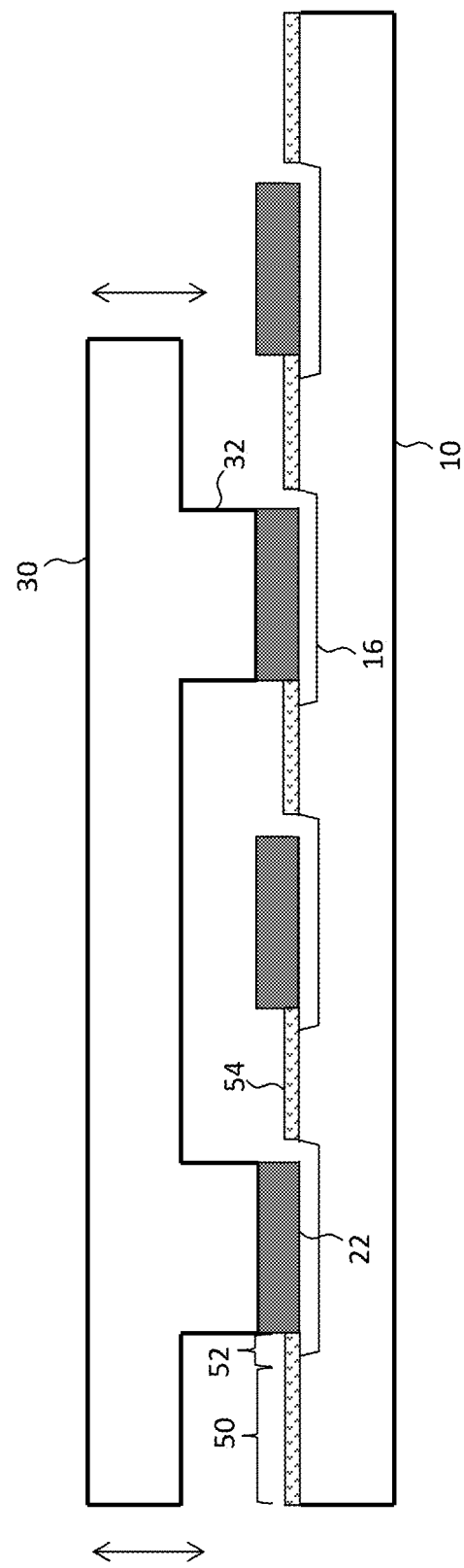
FIG. 5 is a schematic cross section of the stamp in contact with a subset of second dies on the source wafer according to illustrative embodiments of the present disclosure.

Referring to FIG. 5, sacrificial portions 14 (shown in FIG. 4B) are sacrificed, for example by etching sacrificial portions 14 to form gaps 16, so that second dies 22 are suspended over gaps 16 and attached to anchors 50 of source wafer 10 by tethers 52 that maintain the physical position of second dies 22 with respect to source wafer 10 after sacrificial portions 14 are etched. Stamp 30 is moved into position with respect to source wafer 10, for example by an opto-mechatronic motion platform, and second dies 22 are picked up from source wafer 10 by adhering second dies 22 to stamp 30, for example by pressing stamp 30 against second dies 22 on source wafer 10 with the motion platform and adhering second dies 22 to the distal ends of stamp posts 32, for example with van der Waals or electrostatic forces.

Figure 6B:
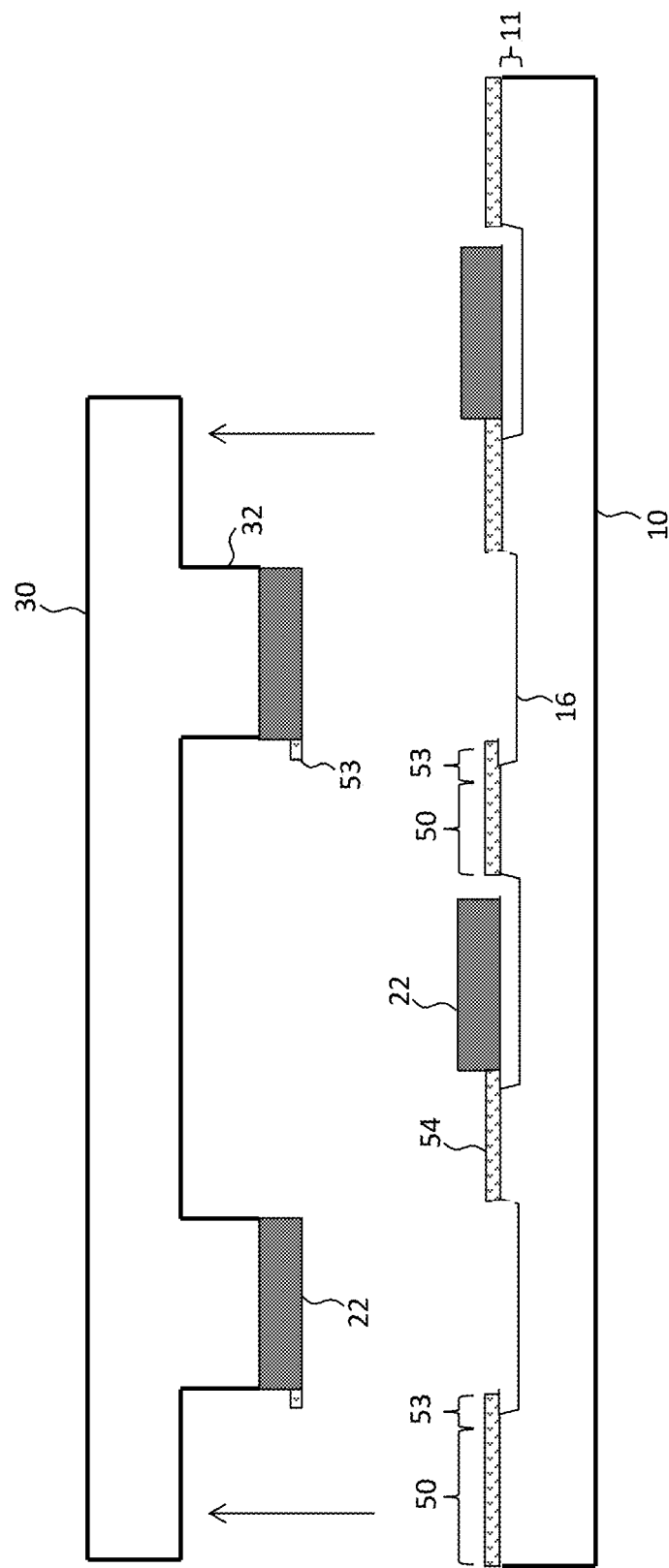

As shown in the FIG. 6A perspective and FIG. 6B cross section taken along cross section line A of FIG. 6A, stamp 30 in contact with second dies 22 suspended over gaps 16 is then removed from source wafer 10 by the motion platform, separating or fracturing dielectric layer 54 tethers 52 from anchors 50 to form separated or fractured tethers 53, respectively, and picking up second dies 22 from source wafer 10 with stamp 30, providing picked-up second dies 22 on stamp posts 32 of stamp 30. Picked-up second dies 22 can comprise a separated or fractured tether 53.

Figure 7B:
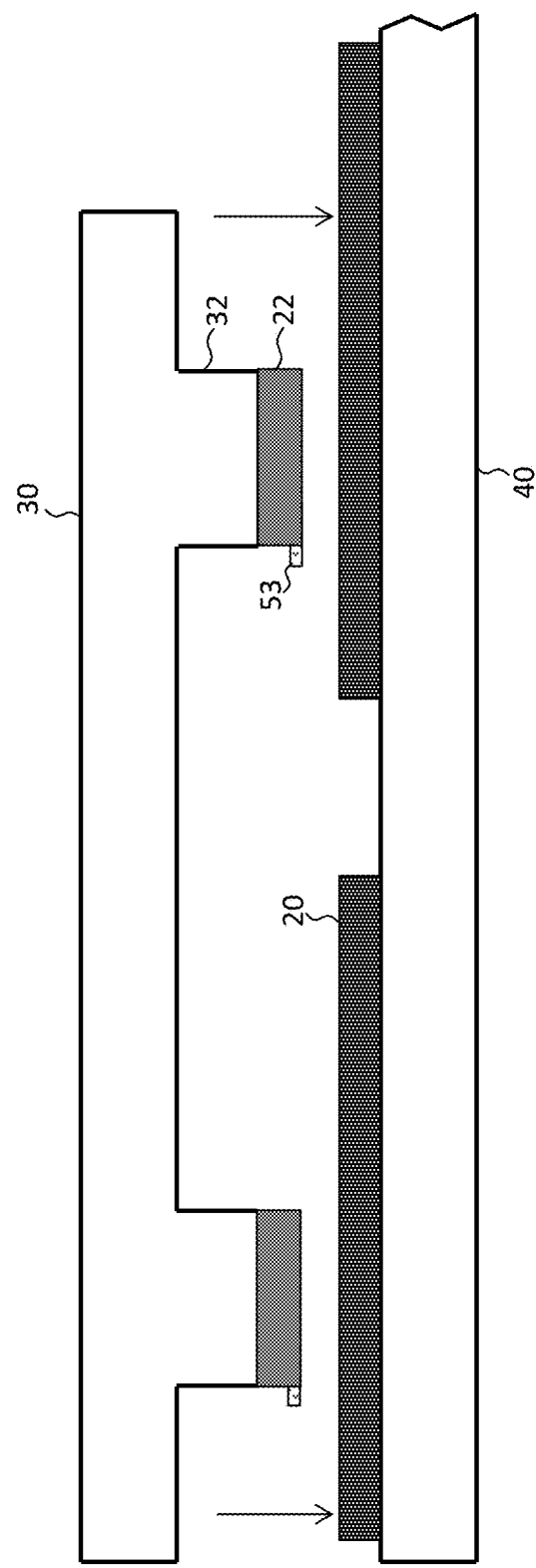

Referring to the perspective of FIG. 7A and cross section of FIG. 7B taken along cross section line A of FIG. 7A, stamp 30 and second dies 22 on stamp posts 32 of stamp 30 with fractured tethers 53 are moved into position and aligned with respect to destination wafer 40.

Figure 8B:
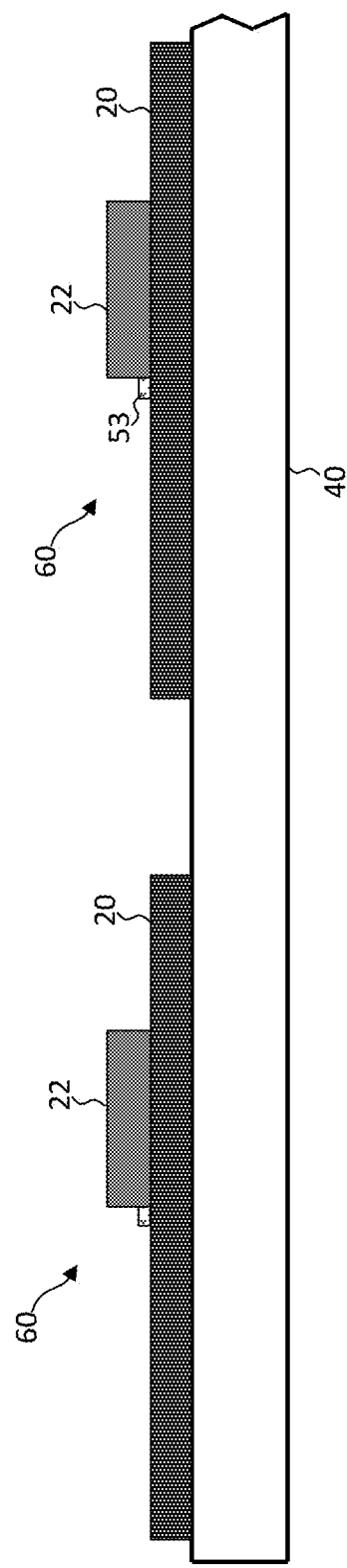

Referring to the perspective of FIG. 8A and cross section of FIG. 8B taken along cross section line A of FIG. 8A, picked-up second dies 22 on stamp 30 with fractured tethers 53 are micro-transfer printed to first dies 20 on or in destination wafer 40 with stamp 30, and stamp 30 is removed. As shown in FIGS. 4A-8B, each of multiple stamp posts 32 of stamp 30 can pick up a second die 22 and transfer print it to a first die 20 of destination wafer 40, so that multiple second dies 22 are transfer printed to corresponding multiple first dies 20 in each transfer print operation.

After second dies 22 are transfer printed onto first dies 20 (step 130), second integrated circuits 23 formed in second dies 22 are each connected to a first integrated circuit 21 in first die 20. A connection can be an electrical connection, for example with electrical conductors such as wires, an optical connection, for example with a light pipe such as a fiber optic or photonic waveguide, or an opto-electronic connection.

Figure 9:
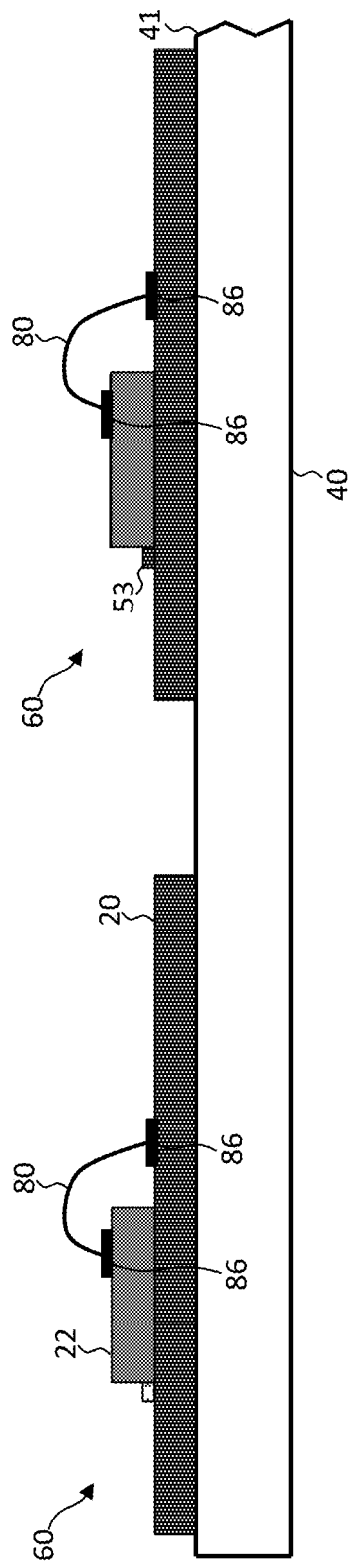
FIG. 9 is a schematic cross section of compound dies with bond wires according to illustrative embodiments of the present disclosure.
Figure 10:
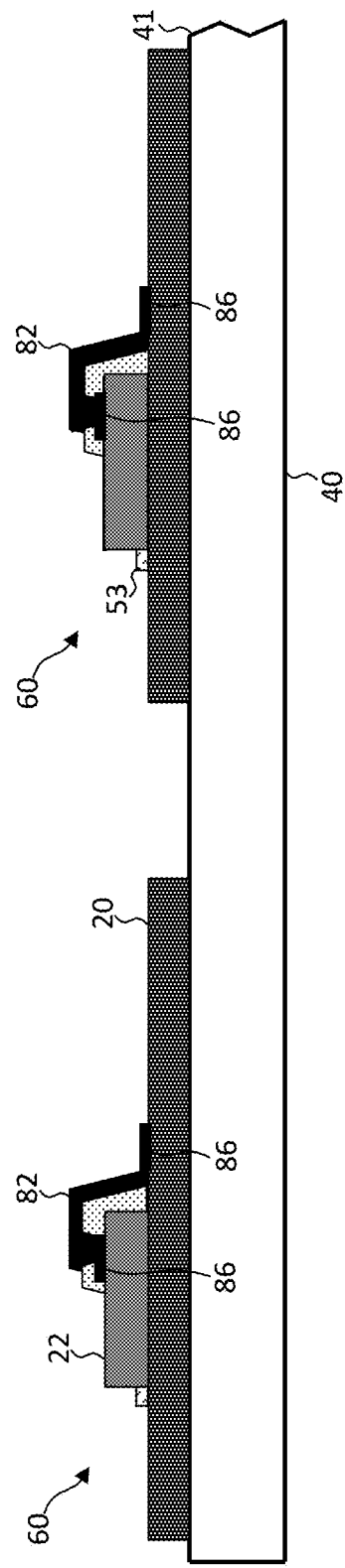
FIG. 10 is a schematic cross section with photolithographically defined connections according to illustrative embodiments of the present disclosure.

As shown in FIG. 9 and in step 140 of FIG. 1, each second die 22 can be connected to a first die 20 after second die 22 is transfer printed to first die 20, for example with bond wires 80 connected to contact pads 86 using wire bonding equipment. In some embodiments, each second die 22 can be connected to a first die 20 after second die 22 is transfer printed to first die 20 by using photolithographic materials and methods to form surface wires 82 (e.g., traces) with or with or without contact pads 86 on the respective surfaces of first and second dies 20, 22, as shown in FIG. 10. Referring to FIG. 11, in some embodiments, connection posts 84 (e.g., spikes) connected to second integrated circuit 23 are formed in or on second dies 22. Connection posts 84 can extend from dies 22 and can have a sharp point that pierces, penetrates, projects into, or otherwise electrically contacts contact pads 86 on first dies 20 to form an electrical connection 70 (shown in FIG. 13) between second integrated circuit 23 and first integrated circuit 21 when second die 22 is transfer printed onto first die 20, for example by micro-transfer printing. In some such embodiments, the connection step 140 is the same step as the transfer print step 130 and is illustrated as combined step 135 in FIG. 1. Connection posts can require less space than, for example, contact pads for wire bonding or surface wires 82 (shown in FIG. 10), and therefore enable reduced size of second dies 22, thereby reducing the cost and visibility of second dies 22, as well as reducing the number of manufacturing steps required to combine and connect first and second integrated circuits 21, 23 and construct compound die 60.

Referring to FIG. 12, after second dies 22 are transfer printed onto first dies 20 forming compound die 60, compound die 60 can be packaged (step 150, FIGS. 1 and 2) to construct a secure integrated-circuit system 99. Suitable ceramic and plastic integrated circuit packages (e.g., dual in-line packages or small-outline integrated circuit packages), are widely available in the integrated-circuit industry and typically comprise a package cavity 92 into which an integrated circuit is disposed and electrically connected with bond wires. According to some embodiments, compound die 60 is disposed in or on, and optionally adhered to, package 90, for example in package cavity 92, and electrically connected to package leads 94, for example with package bond wires 96 and contact pads 86, to provide connections from external devices to first and second integrated circuit 21, 23. In some embodiments, rather than connecting second integrated circuit 23 to first integrated circuits 21 before packaging (e.g., as in steps 140, 135 in FIG. 1), second integrated circuits 23 are connected to first integrated circuits 21 after packaging (e.g., as in step 141, FIG. 2), for example with bond wires 80 (not shown between first and second integrated circuits 21, 23 in FIG. 12).

Figure 13:
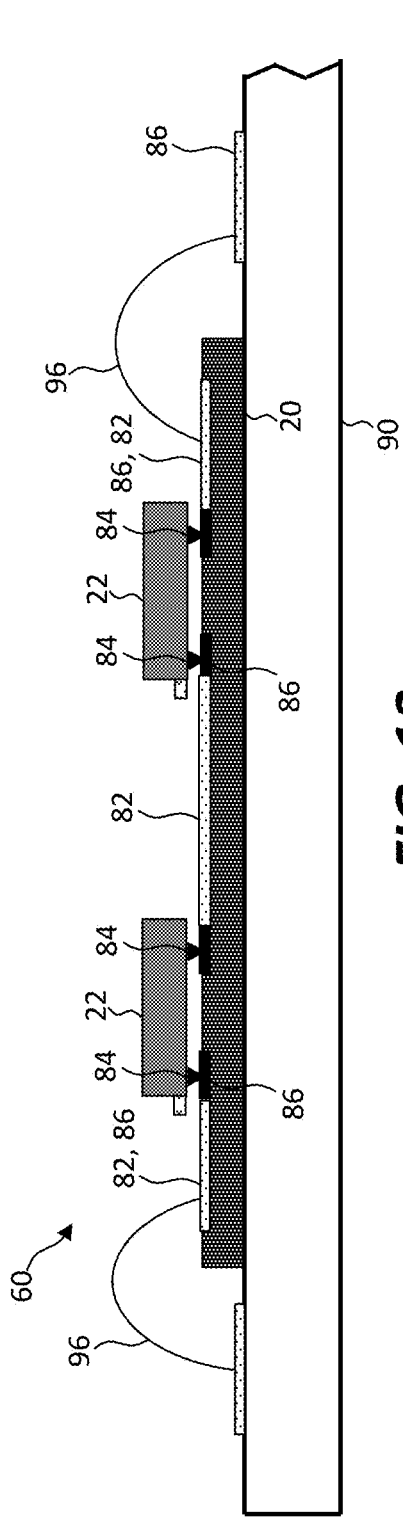
FIG. 13 is a schematic cross section of compound dies with bond wires and connection posts according to illustrative embodiments of the present disclosure.
Figure 14:
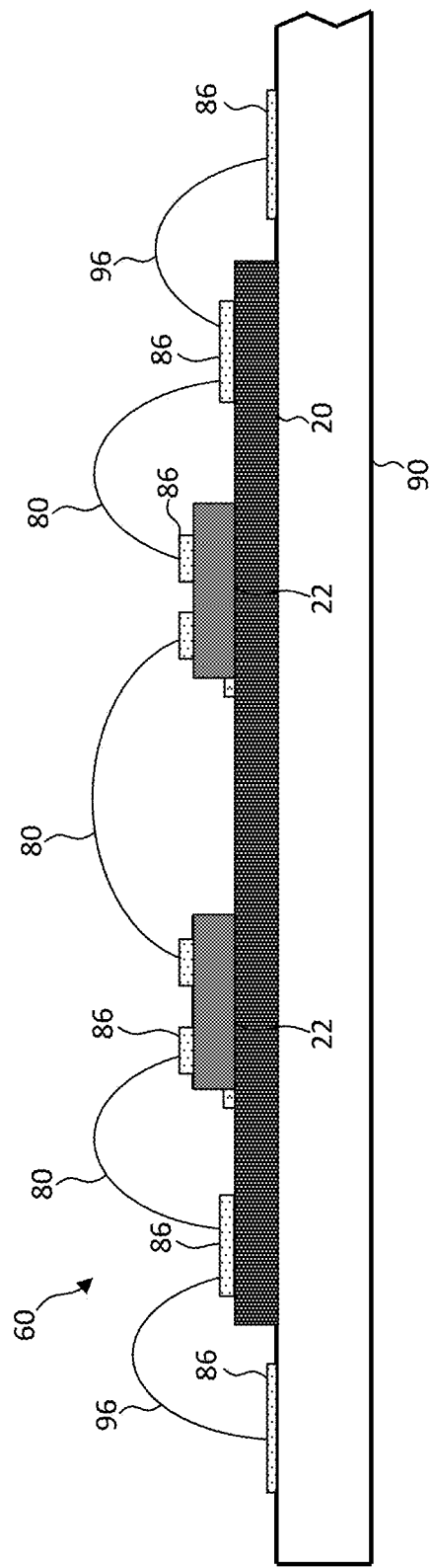
FIG. 14 is a schematic cross section of compound dies with bond wires according to illustrative embodiments of the present disclosure.
Figure 15:
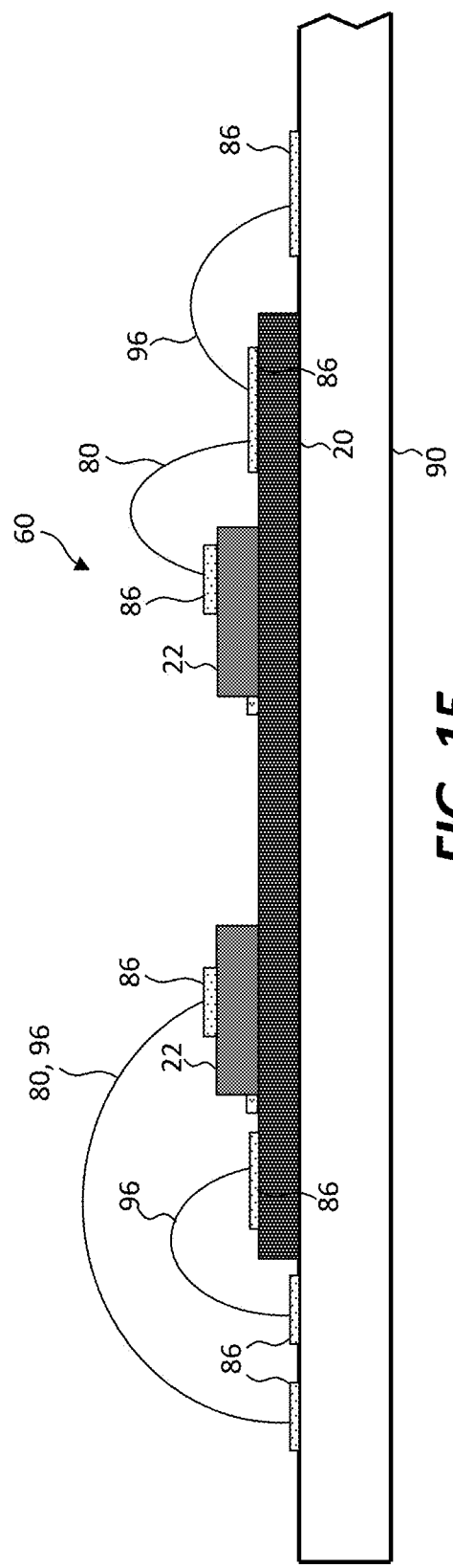
FIG. 15 is a schematic cross section of compound dies with bond wires according to illustrative embodiments of the present disclosure.

In some embodiments, second integrated circuit 23 is connected to package 90 in a variety of different ways (e.g., by connecting contact pads 86 on second die 22 to contact pads on package 90, respectively). Such connections can directly enable connection to package leads 94 or connect to first integrated circuit 21 through an additional connection between package 90, package leads 94, and first die 20. Referring to FIG. 13, connections between multiple second dies 22 disposed on a common first die 20 and the common first die 20 are made with connection posts 84 (e.g., as shown in FIG. 13) and surface wires 82. Connections between first die 20 and package contact pads 86 are made with package bond wires 96 to package contact pads 86. FIG. 14 illustrates bond wires 80 directly connecting second dies 22. In FIG. 15, (package) bond wires 80, 96 directly connect a second die 22 to a contact pad 86 on package 90. Referring to FIGS. 13-15, although not shown, in some embodiments, package contact pads 86 are connected to package leads 94 (FIG. 12), providing an external connection to compound die 60.

Figure 16:
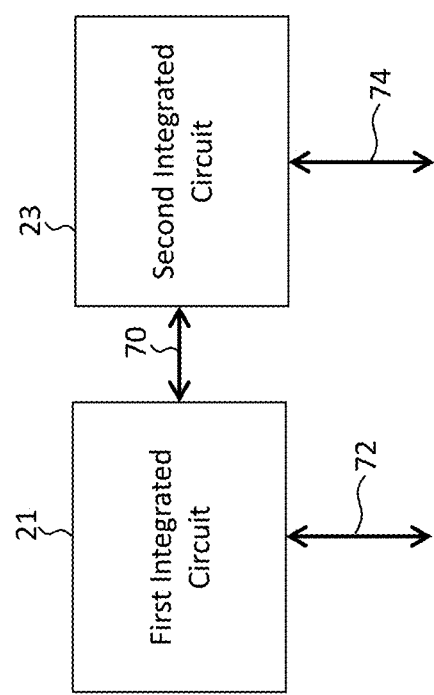
FIG. 16 is a schematic illustrating the operation of compound dies according to illustrative embodiments of the present disclosure.

In some embodiments, and as illustrated in FIG. 16, first and second integrated circuits 21, 23 are directly connected (e.g., as shown in FIGS. 9-11) with electrical connections 70, for example transmitting signals through bond wires 80 (shown in FIG. 9), surface wires 82 (shown in FIG. 10), or connection posts 84 (shown in FIG. 11). First integrated circuit 21 can be connected to external devices or systems through input/output signals 72 (as can second integrated circuit 23, although not shown in FIG. 16), for example through package bond wires 96 and package leads 94. Second integrated circuit 23 can output monitor signal 74, either directly through package bond wires 96 and package leads 94 or indirectly through first die 20 or first integrated circuit 21.

In some embodiments, post processing (e.g., photolithographic processing) of first die 20 or compound die 60 is reduced by using transfer printing to construct compound die 60. Contact pads 86 on first die 20 can be left exposed, for example to enable wire bonding or to enable transfer printing to contact pads 86 (e.g., as shown FIG. 11). After compound die 60 is formed and first and second integrated circuits 21, 23 are connected, it may only be necessary to provide an encapsulating layer to complete compound die 60. By minimizing post processing, additional processing expenses after first integrated circuit 21 is completed can be reduced or obviated. By integrating first and second dies 20, 22 into a single compound die 60, only a single package 90 is needed which may further reduce size, manufacturing steps, and cost.

In operation, power is provided to first and second integrated circuit 21, 23, for example through package leads 94. Second integrated circuit 23 can receive power through first integrated circuit 21 or directly through package bond wires 96 and package leads 94 (e.g., as shown in FIG. 15). Once powered, first integrated circuit 21 operates and second integrated circuit 23 observes and monitors the operation of first integrated circuit 21. If an anomaly is detected, second integrated circuit 23 provides a monitor signal 74 (e.g., as shown in FIG. 16) that indicates anomalous operation. Monitor signal 74 can be provided on a dedicated and direct connection, e.g., through a direct connection between second integrated circuit 23 and a package lead 94 (e.g., as shown in FIG. 15). Monitor signal 74 can be provided through first integrated circuit 21 and a dedicated connection (e.g., as shown in FIGS. 13 and 14), or indirectly through one or more connections and package leads 94 that are used for other signals, as well.

In some embodiments, second die 22 is much smaller than first die 20. Such small dies can be transfer printed onto a surface of a semiconductor wafer or circuit and can be so small that they are difficult to observe, providing additional security to a compound die 60. For example, in some embodiments, first die 20 has an area that is at least ten (e.g., at least twenty, at least fifty, at least one hundred, at least two hundred and fifty, at least five hundred, at least one thousand, at least five thousand, at least ten thousand, at least one hundred thousand, at least one million, at least one hundred million, or at least one billion times) larger than an area of second die 22. In some embodiments, second die 22 has an area that is at least ten (e.g., at least twenty, at least fifty, at least one hundred, at least two hundred and fifty, at least five hundred, at least one thousand, at least five thousand, at least ten thousand, at least one hundred thousand, at least one million, at least one hundred million, or at least one billion times) smaller than an area of first die 22. In some embodiments, second die 22 can have a length and a width that are both less than or equal to 200 microns, 100 microns, 50 microns, 25 microns, or 10 microns. For example, first die 20 can have a length and width of ten centimeters (with an area of one hundred million square microns) and second die 22 can have a length and width of 100 microns (with an area of ten thousand square microns) and an area ratio of ten thousand.

As discussed above, some methods comprise providing a plurality of first dies 20, for example on a first destination wafer 40 (step 100), providing a plurality of second dies 22 (step 110), for example in a source wafer 10, and transfer printing only one second die 22 of the plurality of second dies 22 onto each first die 20 of the plurality of first dies 20 (step 130). Some embodiments comprise transfer printing multiple second dies 22 from a source wafer 10 to multiple first dies 20 in a common step, with one second die 22 transfer printed to each first die 20. In some embodiments and as shown in FIG. 12, compound die 60 comprises two or more second dies 22 and second integrated circuits 23. Multiple second dies 22 can be micro-transfer printed to a common first die 20, for example from different source wafers 10, with multiple repetitions of transfer printing step 130. The multiple second integrated circuits 23 can be connected to provide a larger and more complex monitor circuit. Thus, some embodiments comprise providing multiple source wafers 10 each having a plurality of second dies 22 and transfer printing a second die 22 from each source wafer 10 onto a common first die 20, so that each first die 20 has two or more second dies 22 disposed thereon. Each second integrated circuit 23 on a common first die 20 can be connected together to form a single monitor circuit.

According to some embodiments, a secure integrated-circuit system 99 comprises a first integrated circuit 21 in a first die 20 having a first die size. The first integrated circuit can be constructed in an insecure facility. A second integrated circuit 23 in a second die 22 has a second die size smaller than the first die size. The second integrated circuit can be constructed in a secure facility. The second integrated circuit 23 is operable to monitor the operation of the first integrated circuit 21 and provides a monitor signal 74 responsive to the operation of the first integrated circuit 21. The second die 22 is transfer printed onto the first die 20 and the second integrated circuit 23 is connected to the first integrated circuit 21 to provide a compound die 60. The compound die 60 is disposed in a package 90. In some embodiments, the second die 22 comprises a fractured or separated tether.

In some embodiments, secure integrated-circuit system 99 comprise two or more second dies 22 on a common first die 20. The two or more second dies 22 are connected together to form a monitor circuit.

Transfer printing, for example micro-transfer printing, can include transferring second dies 22 from a source substrate (e.g., source wafer 10) to first dies 20 of a destination substrate (e.g., destination wafer 40). Methods of micro-transfer printing can comprise contacting second dies 22 on source wafer 10 with a stamp 30 to remove second dies 22 from source wafer 10, transferring stamp 30 and contacted second dies 22 to first dies 20 of destination wafer 40, and contacting second dies 22 to a surface of first dies 20 of destination wafer 40. Second dies 22 can be adhered to stamp 30 or first dies 20 of destination wafer 40 by, for example, van der Waals forces, electrostatic forces, magnetic forces, chemical forces, or adhesives. In some embodiments of the present disclosure, second dies 22 are adhered to stamp 30 with separation-rate-dependent adhesion, for example kinetic control of viscoelastic stamp materials such as can be found in elastomeric transfer devices such as a PDMS stamp 30. Stamps 30 can comprise stamp posts 32 having a stamp post area on the distal end of stamp posts 32. Stamp posts 32 can have a length, width, or both length and width, similar or substantially equal to the length, width, or both length and width of second die 22. In some embodiments, stamp posts 32 are smaller than second dies 22 in one or two orthogonal directions.

In exemplary methods, a viscoelastic elastomer (e.g., PDMS) stamp 30 (e.g., comprising a plurality of stamp posts 32) is designed and fabricated to retrieve and transfer arrays of second dies 22 from their native source wafer 10 onto non-native destination wafers 40 or other non-native destination substrates. Stamp 30 mounts onto motion-plus-optics machinery (e.g., an opto-mechatronic motion platform) that can precisely control stamp 30 alignment and kinetics with respect to both source wafers 10 and destination wafers 40. During micro-transfer printing, an opto-mechatronic motion platform brings stamp 30 into contact with second dies 22 on source wafer 10, with optical alignment performed before contact. Rapid upward movement of the print-head and stamp 30 fractures second die 22 tether(s) 52 forming fractured tethers 53, transferring second die(s) 22 from source wafer 10 to stamp 30 or stamp posts 32. The populated stamp 30 then travels to destination wafer 40 and one or more second dies 22 are then aligned to destination wafer 40 and printed on a surface of first die 20 of destination wafer 40.

In some embodiments, a source wafer 10 has releasable (e.g., micro-transfer-printable) second dies 22 that can be transferred, for example with a stamp 30. For example, a source wafer 10 can be a semiconductor (e.g., silicon in a crystalline or non-crystalline form or crystalline silicon having a crystal structure of (1 0 0) or (1 1 1)), a compound semiconductor (e.g., comprising GaN or GaAs), or a glass, polymer, sapphire, or quartz wafer. Sacrificial portions 14 can be formed of a patterned oxide (e.g., silicon dioxide) or nitride (e.g., silicon nitride) layer or can be an anisotropically etchable portion of sacrificial layer 11 of source wafer 10. Typically, but not necessarily, source wafers 10 are smaller than destination wafers 40.

Second dies 22 can be any transfer printable structure, for example including a wide variety of active or passive (or active and passive) second dies 22 and can be or include any one or more of integrated devices, integrated circuits (such as CMOS circuits), computers, communication equipment, light-emitting diodes, photodiodes, sensors, electrical or electronic devices, optical devices, opto-electronic devices, magnetic devices, magneto-optic devices, magneto-electronic devices, and piezo-electric device, materials or structures. Second dies 22 can comprise electronic circuits that operate second die 22. Second dies 22 can be responsive to electrical energy, to optical energy, to electromagnetic energy, or to mechanical energy. For example, in some embodiments, second die 22 includes a light-emitting diode (LED), for example to provide a monitor signal 74.

In some embodiments, second dies 22 formed or disposed in or on source wafers 10 can be constructed using one or more of integrated circuit, micro-electro-mechanical, and photolithographic methods. Second dies 22 can comprise one or more different materials, for example non-crystalline or crystalline semiconductor materials such as silicon or compound semiconductor materials or non-crystalline or crystalline piezo-electric materials.

In some embodiments of the present disclosure, second dies 22 are native to and formed on sacrificial portions 14 of source wafers 10 and can include seed layers for constructing crystalline layers on or in source wafers 10. Second dies 22, sacrificial portions 14, anchors 50, and tethers 52 can be constructed using photolithographic processes, for example.

Second dies 22 can be micro-devices having a length and/or width less than or equal to 200 microns, less than or equal to 100 microns, less than or equal to 50 microns, less than or equal to 25 microns, less than or equal to 15 microns, less than or equal to 10 microns, or less than or equal to five microns, and, optionally, a thickness of less than or equal to 50 microns, less than or equal to 25 microns, less than or equal to 15 microns, less than or equal to 10 microns, less than or equal to five microns, less than or equal to two microns, or less than or equal to one micron. Second dies 22 can be unpackaged dies (also referred to in the plural as dice, each an unpackaged die) transferred directly from native source wafers 10 on or in which second dies 22 are constructed to first dies 20 of destination wafer 40. First dies 20 can be native to and formed on or in destination wafers 40. Thus, second dies 22 can be non-native to destination wafers 40. First dies 20 can be, but are not necessarily, transfer printable, having similar materials or structures as second dies 22 (e.g., including fractured or separated tethers after transfer).

Anchors 50 and tethers 52 can each be or can each comprise portions of source wafer 10 that are not sacrificial portions 14 and can include layers formed on source wafers 10, for example dielectric or metal layers and for example layers formed as a part of photolithographic processes used to construct or encapsulate second dies 22.

Destination wafer 40 can be any destination substrate or target substrate, for example having first dies 20 disposed thereon to which second dies 22 are transfer printed. For example, destination wafer 40 can be a semiconductor wafer, flat-panel display substrate, printed circuit board, or similar substrate. Destination wafers 40 can be, for example substrates comprising glass, polymer, quartz, ceramics, metal, or sapphire. Destination wafers 40 can be semiconductor substrates (for example silicon) or compound semiconductor substrates and can have multiple layers.

In some embodiments of the present disclosure, a layer of adhesive, such as a layer of resin, polymer, or epoxy, either curable or non-curable, adheres second dies 22 onto first dies 20 on destination wafer 40 and can be disposed, for example by coating or lamination. In some embodiments, the layer of adhesive is disposed in a pattern, for example using inkjet, screening, or photolithographic techniques. In some embodiments, a layer of adhesive is coated, for example with a spray or slot coater, and then patterned, for example using photolithographic techniques.

Patterned electrical conductors (e.g., wires, surface wires 82, bond wires 80, traces, or electrical contact pads 86, such as those found on semiconductor wafers, printed circuit boards, flat-panel display substrates, and in thin-film circuits) can be formed on any combination of second dies 22, first dies 20, and destination wafer 40, and any one can comprise electrical contact pads that electrically connect to second dies 22. Such patterned electrical conductors (e.g., wires, surface wires 82, bond wires 80) and contact pads 86 can comprise, for example, metal, transparent conductive oxides, or cured conductive inks and can be constructed using photolithographic methods and materials. For example, metals such as aluminum, gold, or silver can be deposited by evaporation and patterned using pattern-wise exposed, cured, and etched photoresists, or constructed using imprinting methods and materials or inkjet printers and materials, for example comprising cured conductive inks deposited on a surface or provided in micro-channels in or on first dies 20 or destination wafer 40.

Micro-transfer printing processes and structures suitable for disposing second dies 22 onto first dies 20 of destination wafers 40 are described in *Inorganic light-emitting diode displays using micro-transfer printing* (Journal of the Society for Information Display, 2017, DOI #10.1002/jsid.610, 1071-0922/17/2510-0610, pages 589-609), U.S. Pat. No. 8,722,458 entitled Optical Systems Fabricated by Printing-Based Assembly, U.S. patent application Ser. No. 15/461,703 entitled Pressure-Activated Electrical Interconnection by Micro-Transfer Printing, U.S. Pat. No. 8,889,485 entitled Methods for Surface Attachment of Flipped Active Components, U.S. patent application Ser. No. 14/822,864 entitled Chiplets with Connection Posts, U.S. patent application Ser. No. 14/743,788 entitled Micro-Assembled LED Displays and Lighting Elements, and U.S. Pat. No. 10,153,256, entitled Micro-Transfer Printable Electronic Component, the disclosure of each of which is incorporated herein by reference in its entirety.

For a discussion of micro-transfer printing techniques, see also U.S. Pat. Nos. 7,622,367 and 8,506,867, each of which is hereby incorporated by reference in its entirety. Micro-transfer printing using compound micro-assembly structures and methods can also be used with the present disclosure, for example, as described in U.S. patent application Ser. No. 14/822,868, filed Aug. 10, 2015, entitled Compound Micro-Assembly Strategies and Devices, which is hereby also incorporated by reference in its entirety. In some embodiments, micro-transfer printed structure 99 is a compound micro-assembled structure (e.g., a macro-system).

According to various embodiments of the present disclosure, source wafer 10 can be provided with second dies 22, patterned sacrificial portions 14, tethers 52, and anchors 50 already formed, or they can be constructed as part of a method in accordance with certain embodiments of the present disclosure. Source wafer 10 and second dies 22, micro-transfer printing device (e.g., a stamp 30), and first dies 20 of destination wafer 40 can be made separately and at different times or in different temporal orders or locations and provided in various process states.

The spatial distribution of any one or more of second dies 22 and first dies 20 is a matter of design choice for the end product desired. In some embodiments of the present disclosure, all second dies 22 in an array on a source wafer 10 are transferred to a stamp 30 in a single transfer. In some embodiments, a subset of second dies 22 in an array on a source wafer 10 is transferred in a single transfer. By varying the number and arrangement of stamp posts 32 on transfer stamps 30, the distribution of second dies 22 on stamp posts 32 of the transfer stamp 30 can be likewise varied, as can the distribution of second dies 22 on first dies 20 of destination wafer 40.

Because second dies 22, in certain embodiments, can be made using integrated circuit photolithographic techniques having a relatively high resolution and cost and destination wafer 40, for example a printed circuit board, can be made using printed circuit board techniques having a relatively low resolution and cost, electrical conductors and contact pads 86 on destination wafer 40 may be much larger than electrical contacts or electrodes on second die 22 (or first dies 20), thereby reducing manufacturing costs. For example, in certain embodiments, micro-transfer printable second die 22 has at least one of a width, length, and height from 0.5 μm to 200 μm (e.g., 0.5 to 2 μm, 2 to 5 μm, 5 to 10 μm, 10 to 20 μm, 20 to 50 μm, or 50 to 100 μm, or 100 to 200 μm).

In certain embodiments, destination wafer 40 comprises a member selected from the group consisting of polymer, plastic, resin, polyimide, PEN, PET, metal, metal foil, glass, a semiconductor, a compound semiconductor, and sapphire.

In certain embodiments, destination wafer 40 has a thickness from 5 microns to 20 mm (e.g., 5 to 10 microns, 10 to 50 microns, 50 to 100 microns, 100 to 200 microns, 200 to 500 microns, 500 microns to 0.5 mm, 0.5 to 1 mm, 1 mm to 5 mm, 5 mm to 10 mm, or 10 mm to 20 mm).

First dies 20 and second dies 22, in certain embodiments, can be constructed using foundry fabrication processes used in the art. Layers of materials can be used, including materials such as metals, oxides, nitrides and other materials used in the integrated-circuit art. Each first die 20 or second die 22 can be or include a complete semiconductor integrated circuit and can include, for example, one or more of a transistor, a diode, a light-emitting diode, and a sensor. Second dies 22 can have different sizes, for example, 100 square microns or larger, 1000 square microns, larger or 10,000 square microns or larger, 100,000 square microns or larger, or 1 square mm or larger. Second dies 22 can have variable aspect ratios, for example between 1:1 and 10:1 (e.g., 1:1, 2:1, 5:1, or 10:1). Second dies 22 can be rectangular or can have other shapes. Likewise, first dies 20 can be rectangular and have a size greater than a size of second dies 22, for example having a size greater than 100,000 square microns, 1,000,000 square microns, 100,000,000 square microns, or 1,000,000,000 square microns.

In some embodiments, transferring or transfer printing occurs by micro-transfer-printing. In some embodiments, micro-transfer printing involves using a transfer device (e.g., an elastomeric stamp 30, such as a PDMS stamp 30) to transfer a second die 22 using controlled adhesion. For example, an exemplary transfer device can use kinetic or shear-assisted control of adhesion between a transfer device and a second die 22. It is contemplated that, in certain embodiments, where a method is described as including micro-transfer-printing a second die 22, other analogous embodiments exist using a different transfer method. In some examples, transferring a second die 22 (e.g., from a source wafer 10 or wafer to a first die 20 of destination wafer 40) can be accomplished using any one or more of a variety of known techniques. For example, in certain embodiments, a pick-and-place method can be used. As another example, in certain embodiments, a flip-chip method can be used (e.g., involving an intermediate, handle or carrier substrate). In methods according to certain embodiments, a vacuum tool or other transfer device is used to transfer a second die 22.

As is understood by those skilled in the art, the terms "over" and "under" are relative terms and can be interchanged in reference to different orientations of the layers, elements, and substrates included in the present disclosure. Furthermore, a first layer "on" a second layer is a relative orientation of the first layer to the second layer that does not preclude additional layers being disposed therebetween. For example, a first layer on a second layer, in some implementations, means a first layer directly on and in contact with a second layer. In other implementations, a first layer on a second layer includes a first layer and a second layer with another layer therebetween (e.g., and in mutual contact).

Throughout the description, where apparatus and systems are described as having, including, or comprising specific elements, or where processes and methods are described as having, including, or comprising specific steps, it is contemplated that, additionally, there are apparatus and systems of the disclosed technology that consist essentially of, or consist of, the recited elements, and that there are processes and methods according to the disclosed technology that consist essentially of, or consist of, the recited processing steps.

It should be understood that the order of steps or order for performing certain action is immaterial so long as the disclosed technology remains operable. Moreover, two or more steps or actions in some circumstances can be conducted simultaneously.

Having described certain implementations of embodiments, it will now become apparent to one of skill in the art that other implementations incorporating the concepts of the disclosure may be used. Therefore, the disclosure should not be limited to certain implementations, but rather should be limited only by the spirit and scope of the following claims.

PARTS LIST

A cross section line
10 source wafer
11 sacrificial layer
14 sacrificial portions
16 gap
20 first die
21 first integrated circuit
22 second die
23 second integrated circuit
30 stamp
32 stamp post
40 destination wafer
50 anchor
52 tether
53 fractured tether
54 dielectric layer
60 compound die
70 electrical connection
72 input/output signals
74 monitor signal
80 bond wires
82 surface wires
84 connection posts
86 contact pad
90 package
92 package cavity
94 package leads
96 package bond wires
99 secure integrated-circuit system
100 provide first die step
110 provide second die step
120 provide package step
130 transfer print second die onto first die step
135 transfer print and connect second integrated circuit to first integrated circuit step
140 connect first integrated circuit to second integrated circuit step
141 connect first integrated circuit to second integrated circuit step
150 package compound die step

What is claimed:

1. A method of making a secure integrated-circuit system, comprising:
   providing a first integrated circuit in a first die having a first die size;
   providing a second integrated circuit in a second die having a second die size smaller than the first die size, wherein the second integrated circuit comprises an electronic monitor circuit comprising transistors;
   micro-transfer printing the second die onto the first die such that the second die is non-native to the first die to provide a compound die, thereby fracturing or separating a tether protruding from a side of the second die;

connecting the second integrated circuit to the first integrated circuit to provide a compound die, wherein, after connection, the second integrated circuit is operable to monitor the operation of the first integrated circuit and to provide a monitor signal responsive to the operation of the first integrated circuit; and packaging the compound die.

2. The method of claim 1, wherein the first integrated circuit has been constructed in an insecure facility.

3. The method of claim 1, wherein the second integrated circuit has been constructed in a secure facility.

4. The method of claim 1, wherein the first die has an area that is at least ten larger than an area of the second die no more than one billion times larger than the area of the second die.

5. The method of claim 1, wherein connecting the second integrated circuit to the first integrated circuit comprises photolithographically forming wires that electrically connect the second integrated circuit to the first integrated circuit.

6. The method of claim 1, wherein the second die comprises one or more connection posts and wherein the first integrated circuit is connected to the second integrated circuit through the one or more connection posts by the micro-transfer printing.

7. The method of claim 1, wherein connecting the second integrated circuit to the first integrated circuit comprises wire bonding the second integrated circuit to the first integrated circuit.

8. The method of claim 1, wherein connecting the second integrated circuit to the first integrated circuit comprises forming an electrical connection, forming an optical connection, or forming an electro-optic connection.

9. The method of claim 1, comprising providing a package comprising a cavity, wherein the step of packaging the compound die comprises disposing the compound die in the cavity.

10. The method of claim 1, wherein the step of packaging the compound die comprises providing package leads and connecting the package leads to the compound die in a package.

11. The method of claim 10, wherein the step of packaging the compound die comprises wire bonding the first integrated circuit to one or more of the package leads.

12. The method of claim 10, wherein the step of packaging the compound die comprises wire bonding the second integrated circuit to one or more of the package leads.

13. The method of claim 1, wherein the second die has a length and a width that are both no more than 200 microns.

14. The method of claim 1, comprising encapsulating the compound die.

15. The method of claim 1, comprising:

providing a plurality of first dies;

providing a plurality of second dies; and micro-transfer printing each second die of the plurality of second dies onto a first die of the plurality of first dies.

16. The method of claim 15, comprising micro-transfer printing multiple second dies in a common step.

17. The method of claim 15, comprising transfer printing only one second die of the plurality of second dies onto each first die of the plurality of first dies.

18. The method of claim 15, comprising transfer printing multiple second dies of the plurality of second dies onto each first die of the plurality of first dies.

19. The method of claim 15, comprising providing multiple source wafers each having a plurality of second dies and micro-transfer printing a second die from each second wafer onto a common first die.

20. The method of claim 19, comprising connecting each second integrated circuit on a common first die together.

* * * * *